United States Patent
Chen et al.

(10) Patent No.: US 9,583,712 B2
(45) Date of Patent: Feb. 28, 2017

(54) HIGH CRYSTALLINE POLYTHIOPHENE NANOWIRE FOR ORGANIC SOLAR PANELS AND METHOD OF PREPARATION THEREOF

(71) Applicant: KUN SHAN UNIVERSITY, Tainan (TW)

(72) Inventors: Jean-Hong Chen, Tainan (TW); Yao-Wei Huang, Tainan (TW); Lung-Chuan Chen, Tainan (TW)

(73) Assignee: Kun Shan University, Tainan (TW)

( * ) Notice: Subject to any disclaimer, the term of this patent is extended or adjusted under 35 U.S.C. 154(b) by 199 days.

(21) Appl. No.: 14/445,179

(22) Filed: Jul. 29, 2014

(65) Prior Publication Data

US 2015/0083184 A1    Mar. 26, 2015

(30) Foreign Application Priority Data

Sep. 23, 2013 (TW) .............................. 102134137 A

(51) Int. Cl.
*H01L 51/00* (2006.01)
*H01L 51/42* (2006.01)
*C08K 3/04* (2006.01)

(52) U.S. Cl.
CPC ............ *H01L 51/0036* (2013.01); *C08K 3/04* (2013.01); *H01L 51/4253* (2013.01); *C08G 2261/3223* (2013.01); *C08G 2261/78* (2013.01); *C08G 2261/91* (2013.01); *C08G 2261/964* (2013.01); *H01L 51/0003* (2013.01); *H01L 51/0048* (2013.01); *Y02E 10/549* (2013.01)

(58) Field of Classification Search
CPC .................................................. H01L 51/0036
See application file for complete search history.

(56) References Cited

U.S. PATENT DOCUMENTS

| 7,247,670 | B2 * | 7/2007 | Malenfant | B82Y 30/00 423/447.1 |
|---|---|---|---|---|
| 2004/0266939 | A1 * | 12/2004 | Chen | B82Y 30/00 524/496 |
| 2006/0189822 | A1 * | 8/2006 | Yoon | B82Y 30/00 560/130 |
| 2012/0164433 | A1 * | 6/2012 | Advincula | B82Y 30/00 428/327 |

FOREIGN PATENT DOCUMENTS

CN            102634212    *   8/2012

* cited by examiner

*Primary Examiner* — Irina Krylova
(74) *Attorney, Agent, or Firm* — Rosenberg, Klein & Lee

(57) ABSTRACT

The present invention relates to a method of preparing high crystalline polythiophene nanowire used for organic solar panels, including the following steps: A. a 0.001-40 wt % polythiophene solution is prepared; B. a 0.01-10 wt % carbon nanomaterial suspension is prepared and a 0.001-5 wt % dispersant is added to the suspension to generate a carbon nanomaterial dispersion; C. The foregoing carbon nanomaterial dispersion is added to the polythiophene solution and the resulting mixture is let stand under atmospheric pressure at −10~45° C. for 20~400 min so that polythiophene molecules are able to be adsorbed and stacked up on the surface of carbon nanomaterials to generate polythiophene nanowires. Owing to high alignment order and high crystallinity, the polythiophene nanowire is helpful for elevating light conversion efficiency of organic solar panels.

3 Claims, 5 Drawing Sheets

A. Preparation of a 0.001- 40 wt% polythiophene solution.

B. Preparation of a 0.01- 10 wt% carbon nano-material suspension and addition of a 0.001- 5 wt% dispersant to the carbon nano-material suspension to generate a carbon nano-material dispersion.

C. Stepwise addition of the carbon nano-material dispersion to the polythiophene solution and letting the mixture stand at -10~ 45°C for 20~ 400 min, wherein the mixing ratio of the polythiophene solution to the carbon nano-material dispersion is between 1: 0.01 and 1: 10.

D. Extraction of the polythiophene nanowires from the mixture of the polythiophene solution and the carbon nano-material dispersion and removal of the polythiophene are amorphous and adsorbed on the polythiophene nanowire with a neutral organic solvent.

E. Addition of the polythiophene nanowire treated with the neutral organic solvent to a solution containing polythiophene and one material selected from carbon nano-tube, graphene and nano-capsule or mixtures thereof to enable the carbon nano-tube, the graphene or the nano-capsule to be filled among the polythiophene nanowires.

FIG. 1

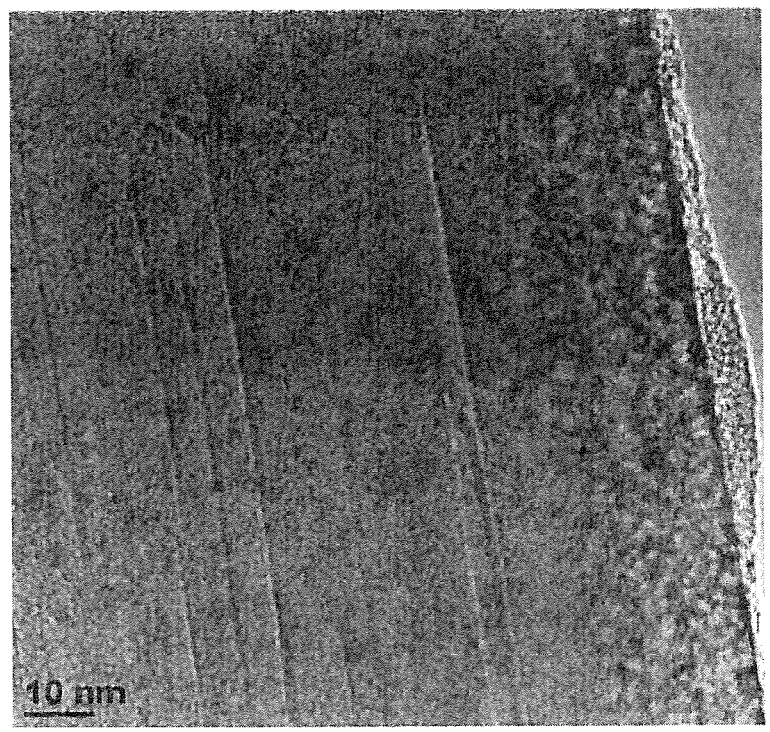
F I G . 4
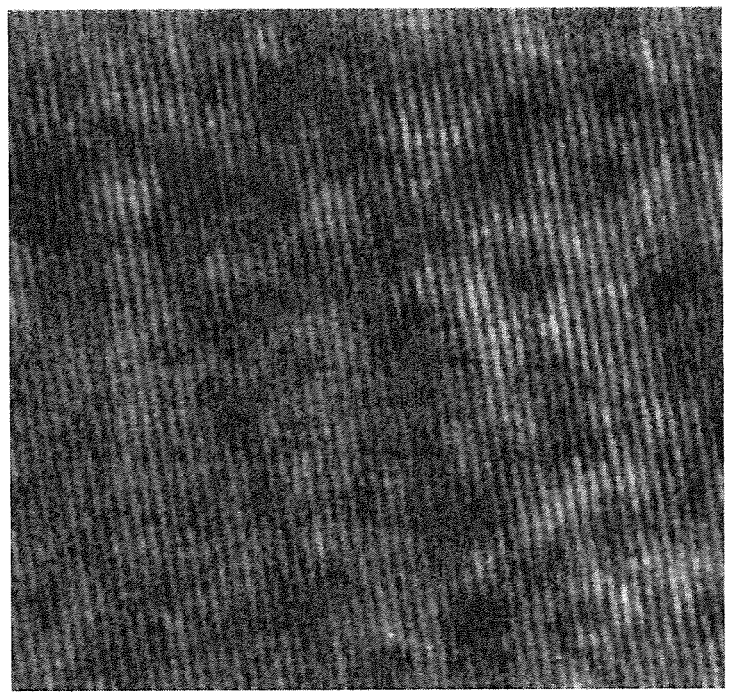
F I G . 5

HIGH CRYSTALLINE POLYTHIOPHENE NANOWIRE FOR ORGANIC SOLAR PANELS AND METHOD OF PREPARATION THEREOF

BACKGROUND OF THE INVENTION

1. Field of the Invention

The present invention relates to a high alignment order and high crystallinity polythiophene nanowire for organic solar panels and to a method of preparation thereof, especially to use of a high crystalline polythiophene nanowire with high alignment and high crystallinity to elevate light conversion efficiency of organic solar panels.

2. The Prior Arts

Currently, materials for active layer of organic solar panels are principally prepared by mixing and dissolving poly(3-hexylthiophene) (P3HT) and carbon-based nano-materials (e.g. phenyl-$C_{61}$-butyric acid methyl ester (PCBM), carbon nano-tube (e.g. SWCNT and MWCNT) or mixtures thereof) in organic solvents, subsequently coating the resulting mixture to generate an active layer in bulk-heterojunctions (BHJ) and then using thermal treatment technique to reinforce the structure of the active layer of organic solar panels.

With regard to polythiophene nanowire for organic solar panels and prior arts for its preparation, as disclosed in Taiwan (ROC) Patent No. 201316582 "organic thin-film solar cells and method of preparation thereof", both p-type semiconductor materials (electron donors) and n-type semiconductor materials (electron acceptors) made out of organic materials were separated from each other by means of phase separation and a bulk heterojunction (BHJ) that could convert light energy into electrical energy was generated in this way.

In the active layers prepared by phase separation technique from the prior arts, polythiophene molecules assembled themselves into polythiophene nano-whiskers in three-dimensional network structure. However, the crystallinity of the polythiophene nanowhiskers prepared by this method (as shown in FIG. 8) was very low (about 30%) and could not be effectively elevated even though they were submitted to subsequent thermal treatment process. And this was reason why the light conversion efficiency of organic solar panels prepared by this method was merely between 2% and 5%.

SUMMARY OF THE INVENTION

The present invention provides a high crystalline polythiophene nanowire for organic solar panels and a method of preparation thereof, in which the high crystalline polythiophene nanowire prepared according to the present invention is used as donor material and one material selected from carbon nano-capsule (e.g. PCBM), carbon nano-tube (CNT) and graphene or mixtures thereof is filled as acceptor material in the network structure of polythiophene nanowires with high alignment order and high crystallinity to elevate separation and transmission of electron-hole pairs in order to further promote the light conversion efficiency of organic solar panels.

The method of preparing polythiophene nanowire for organic solar panels according to the present invention includes the following steps: A. polythiophene (e.g. P3HT or P3AT) is dissolved in the first organic solvent to generate a 0.001-40 wt % polythiophene solution, wherein the said first organic solvent is one solvent selected from toluene, xylene and chloroform or mixtures thereof; B. carbon-based nano-material is added to the second organic solvent to generate a 0.01-10 wt % carbon-based nano-material solution, wherein the said second organic solvent is one solvent selected from toluene, xylene and chloroform or mixtures thereof and a 0.001-5 wt % dispersant is added to the suspension to generate a carbon nano-material dispersion; C. the dispersion of carbon-based nano-material is stepwise added to the polythiophene solution and then the resulting mixture is let stand under atmospheric pressure at −10~45° C. for 20~400 min so that polythiophene molecules in the polythiophene solution can be adsorbed and stacked on the surface of carbon-based nano-material in the dispersion of carbon-based nano-material to generate high alignment order and high crystallinity polythiophene nanowire, wherein the mixing ratio of the solution of polythiophene to the dispersion of carbon-based nano-material falls in the range between 1:0.01 and 1:10.

wherein the said carbon-based nano-material is one material selected from graphene, carbon nano-capsule (e.g. PCBM) and carbon nano-tube or mixtures thereof.

wherein the said dispersant is one dispersant selected from naphthalene, anthracene, phenathrene, hydrocarbon chain-substituted naphthalene, hydrocarbon chain-substituted anthracene, hydrocarbon chain-substituted phenathrene, oxidized hydrocarbon chain-substituted naphthalene, oxidized hydrocarbon chain-substituted anthracene and oxidized hydrocarbon chain-substituted phenathrene or mixtures thereof.

After step c has been completed, the following steps continue to be done: D. high crystalline polythiophene nanowires are extracted from the mixture of polythiophene solution and carbon nano-material dispersion. However the amorphous polythiophene molecules that are cover on the surface of the high crystalline polythiophene nanowire are removed with a neutral organic solvent, wherein the said neutral organic solvent is cyclohexane or methylcyclohexane; E. the high crystalline polythiophene nanowire treated by the neutral organic solvent, and then, it is added to a solution containing minor content of polythiophene and major content of one material selected from carbon nano-tube, graphene and carbon nano-capsule (e.g. PCBM) or mixtures thereof to enable these carbon nano-tubes, graphenes or carbon nano-capsules (e.g. PCBMs) to be filled between the high crystalline polythiophene nanowires.

wherein the said solution contains carbon nano-tube, graphene and PCBM and the mixing ratio of carbon nano-tube to graphene to carbon nano-capsule is 0.1:0.1:1 to 1:1:1 to 10:10:1, preferably 0.2:0.3:1 or 0.4:0.2:1.

wherein the diameter of the high crystalline polythiophene nanowire falls within the range between 1 nm and 20 nm, or within the range between 20 nm and 100 nm, or within the range between 100 nm and 500 nm.

wherein the length of the high crystalline polythiophene nanowire falls within the range between 20 nm and 100 nm, or within the range between 100 nm and 500 nm, or within the range between 500 nm and 50 μm.

The present invention has the effect: the high crystalline polythiophene nanowires prepared by the method of preparing polythiophene nanowire for organic solar panels according to the present invention are used as donor material for the active layer in bulk heterojunction structure due to high alignment and high crystallinity. They are very helpful for elevating transmission efficiency of electron-hole pairs and can further promote light conversion efficiency of organic solar panels.

BRIEF DESCRIPTION OF THE DRAWINGS

FIG. 1: A flow chart according to the present invention.

FIG. 4: an electron micrograph showing internal microstructure of polythiophene nanowire according to the present invention, whereby the internal microstructure exhibits high alignment and high crystallinity.

FIG. 5: an another electron micrograph showing polythiophene nanowire according to the present invention.

DETAILED DESCRIPTION OF THE PREFERRED EMBODIMENT

Taken all the foregoing technical characteristics together, the main effects of both polythiophene nanowire for organic solar panels according to the present invention and the method of preparation thereof may be explicitly elucidated in the following embodiments.

First of all, a preferred embodiment for polythiophene nanowire for organic solar panels according to the present invention as well as the method of preparation thereof is shown in FIG. 1. The method of preparing high crystalline polythiophene nanowire for organic solar panels according to the present invention includes the following steps:

A. polythiophene is dissolved in the first organic solvent to generate a 0.001-40 wt % polythiophene solution, wherein the said first organic solvent is a solvent selected from toluene, xylene and chloroform or mixtures thereof; volume mixing ratios of any two solvents selected from toluene, xylene or chloroform fall in the range between 0.01:1.0 v/v % and 1.0:0.01 v/v %; in this embodiment, polythiophene is dissolved in xylene and a 0.01-10 wt % polythiophene solution is prepared.

B. A carbon-based nano-material is added to the second organic solvent to generate a 0.01-10 wt % carbon-based nano-material solution, wherein the said second organic solvent is a solvent selected from toluene, xylene and chloroform or mixtures thereof; volume mixing ratios of any two solvents selected from toluene, xylene and chloroform fall in the range between 0.01:1.0 v/v % and 1.0:0.01 v/v %; in this embodiment, xylene is used as the second organic solvent as well as the first organic solvent; and a 0.001-5 wt % dispersant is added to the carbon nano-material suspension to generate a carbon nano-material dispersion, wherein the carbon nano-material is one material selected from graphene, carbon nano-capsule (e.g. PCBM) and carbon nano-tube or mixtures thereof; in this embodiment, graphene is added to xylene and the said dispersant is one dispersant selected from naphthalene, anthracene, phenathrene, hydrocarbon chain-substituted naphthalene, hydrocarbon chain-substituted anthracene, hydrocarbon chain-substituted phenathrene, oxidized hydrocarbon chain-substituted naphthalene, oxidized hydrocarbon chain-substituted anthracene and oxidized hydrocarbon chain-substituted phenathrene, whereby adding dispersant is to elevate dispersedness of graphene in the second organic solvent.

Figure 2:
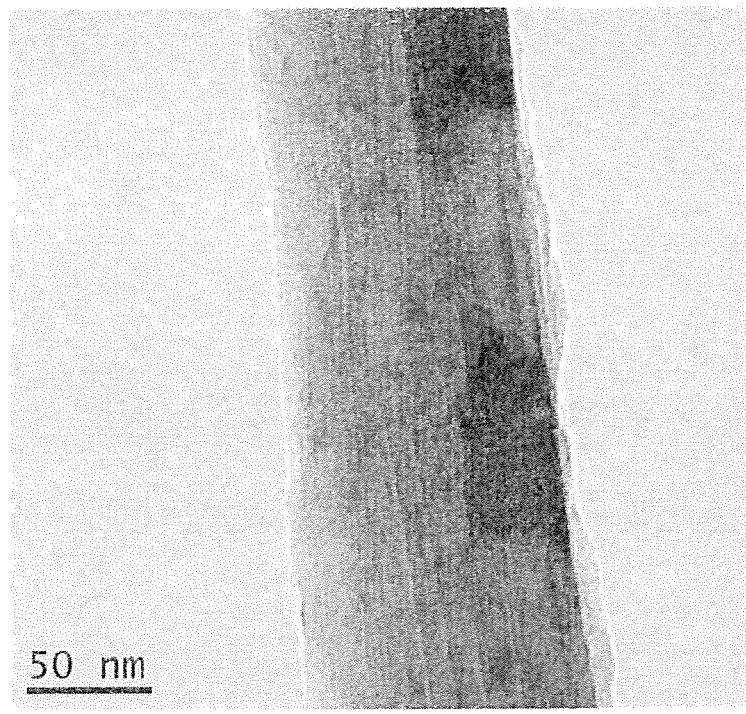
FIG. 2: an electron micrograph showing the high alignment and high crystallinity polythiophene nanowires according to the present invention.
Figure 3:
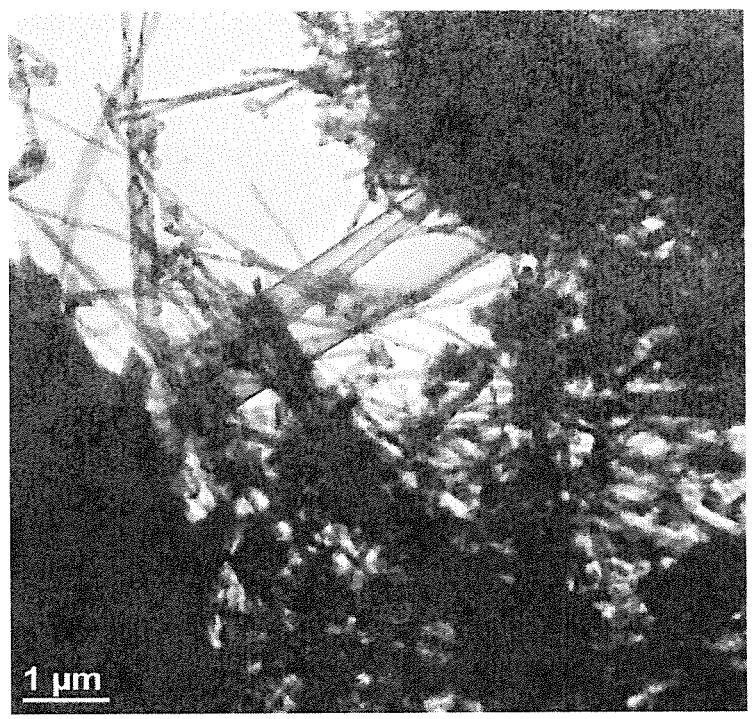
FIG. 3: an electron micrograph showing the network structure in which high crystalline polythiophene nanowires according to the present invention are stacked up through crossing and penetrating each other.
Figure 7:
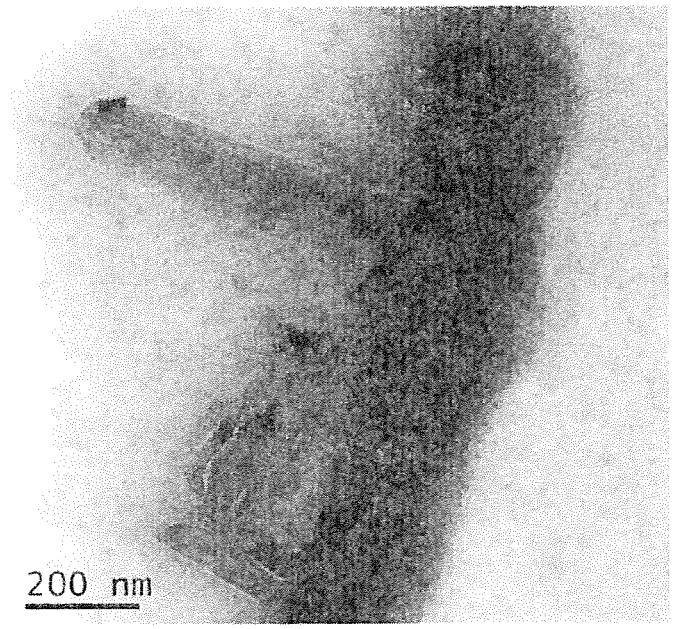
FIG. 7: an electron micrograph showing a nanowhisker prepared by the prior art.
Figure 8:
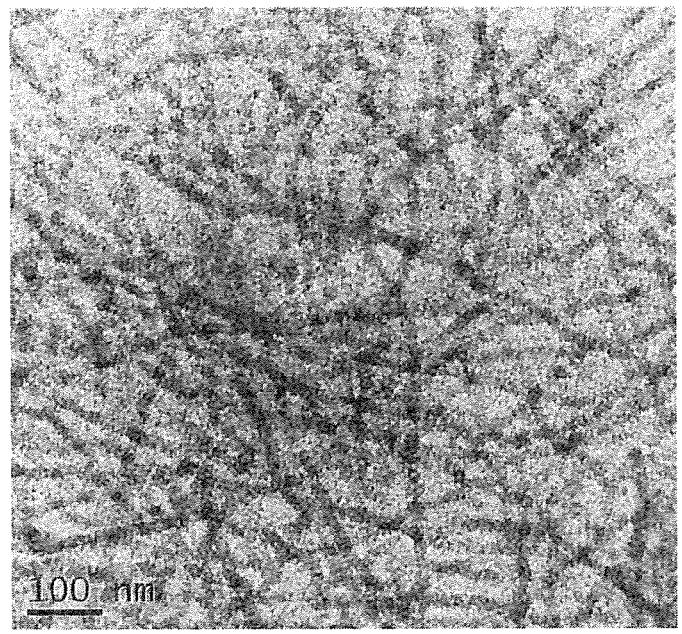
FIG. 8: an another electron micrograph showing polythiophene nanowhiskers prepared by the prior art.

C. The dispersion of carbon-based nanomaterial is stepwise added to the polythiophene solution and then the resulting mixture is let stand under normal pressure at −10° C.~45° C. for 20 min~400 min, so that polythiophene molecules in the polythiophene solution can be adsorbed on the surface of carbon-based nanomaterial in the dispersion of carbon-based nanomaterial and self-assembled or crystallized to form high $\pi$-$\pi$ stacked order and high crystalline polythiophene nanowires (as shown in FIG. 2); and the high crystalline polythiophene nanowires are stacked up through crossing and penetrating each other to form network structure (as shown in FIG. 3); and the internal microstructure of polythiophene nanowire, which exhibits high alignment order and high crystallinity, is shown in FIG. 4 and FIG. 7, wherein the mixing ratio of the solution of polythiophene to the dispersion of carbon-based nanomaterial falls in the range between 1:0.01 and 1:10; in this embodiment, the mixing ratio of the solution of polythiophene to the dispersion of carbon-based nanomaterial falls in the range between 1:0.4 and 1:1.6.

Figure 6:
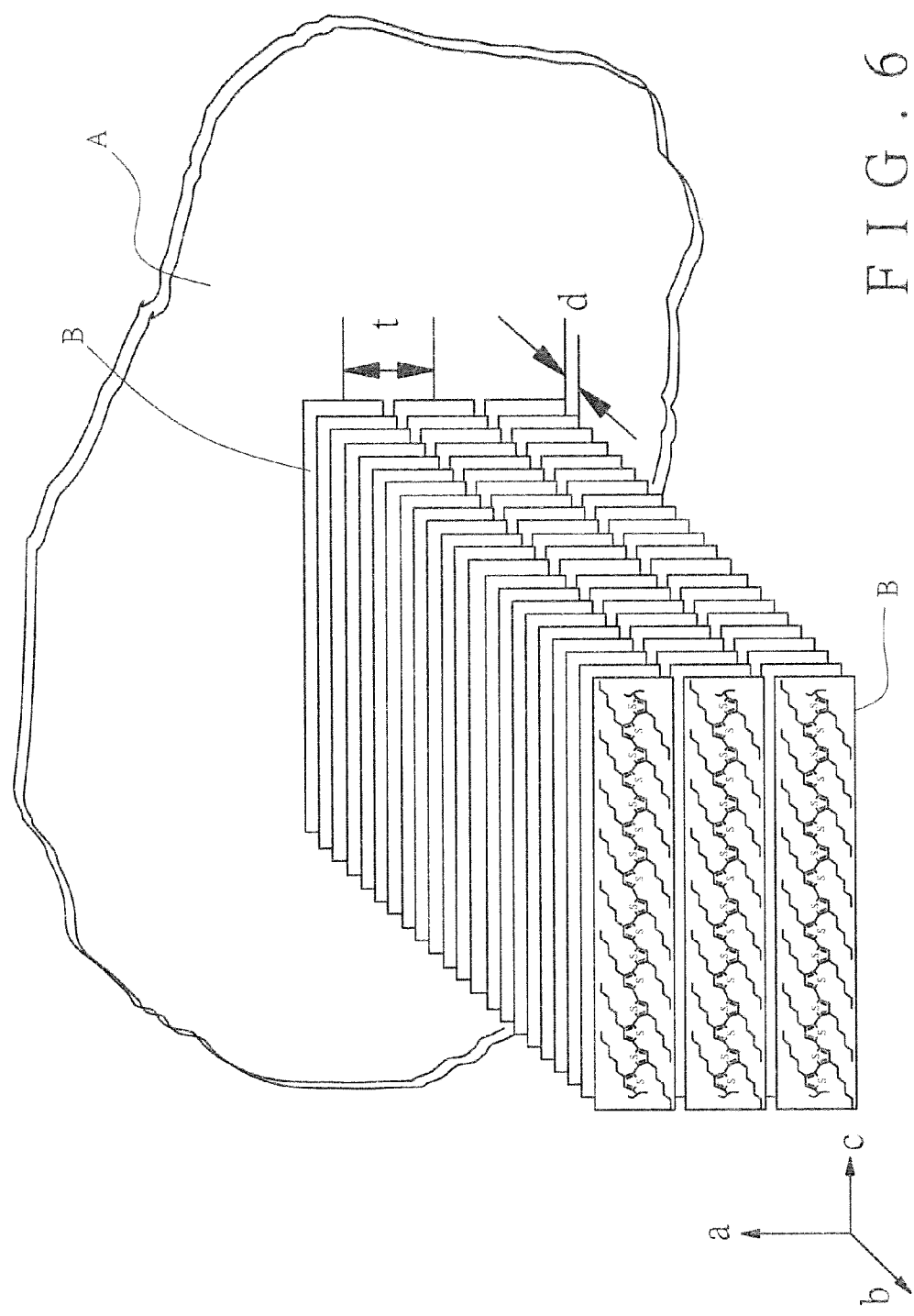
FIG. 6: a schematic diagram showing formation of polythiophene nanowire according to the present invention on the surface of graphene.

As shown in FIG. 5 and FIG. 6, three axial directions, i.e. axial directions a, b and c, are defined in FIG. 6. Polythiophene adsorbs on the surface of graphene (A) and forms a high alignment order $\pi$-$\pi$ stacks (B). The high alignment order $\pi$-$\pi$ stacks (B) are grow up along the axial directions c, then stack up along the axial directions a and b and forms the foregoing polythiophene nanowire, wherein the gap (d) among the foregoing $\pi$-$\pi$ stacks (B) on the axial direction b is 0.34 nm, while the gap (t) among the foregoing $\pi$-$\pi$ stacks (B) on the axial direction a is 1.67 nm.

It should be particularly elucidated that the diameter of polythiophene nanocrystal can be manipulated by the concentration of polythiophene solution as well as by the content of carbon nanomaterial in carbon nanomaterial dispersion. When the mixing ratio of a 0.01-0.5 wt % polythiophene solution to a 0.01-10 wt % carbon nanomaterial dispersion falls in the range between 1:0.8 and 1:1.6, the diameter of polythiophene nanowire falls in the range between 1 nm and 20 nm; when the mixing ratio of a 0.5-3 wt % polythiophene solution to a 0.01-10 wt % carbon nanomaterial dispersion falls in the range between 1:0.4 and 1:1, the diameter of polythiophene nanowire falls in the range between 20 nm and 100 nm; when the mixing ratio of a 3-20 wt % polythiophene solution to a 0.01-10 wt % carbon nanomaterial dispersion fails in the range between 1:0.4 and 1:1, the diameter of polythiophene nanowire falls in the range between 100 nm and 500 nm. However, in another aspect, the length of polythiophene nanowire is affected by ambient temperature as well as by aging time. When ambient temperature is between 35° C. and 45° C. and aging time between 20 min and 400 min, the length of the polythiophene nanowire is in the range between 10 nm and 100 nm; when ambient temperature is between 10° C. and 30° C. and aging time between 20 min and 120 min, the length of the polythiophene nanowire is in the range between 100 nm and 500 nm; when ambient temperature is between −10° C. and 10° C. and aging time between 20 min and 240 min, the length of the polythiophene nanowire is in the range between 500 nm and 50 μm.

D. the polythiophene nanowire is extracted from the mixture of the polythiophene solution and the carbon nano-material dispersion and the polythiophene molecules that are amorphous and adsorbed on the surface of the polythiophene nanowire are removed with a neutral organic solvent, wherein the said neutral organic solvent is cyclohexane or methylcyclohexane. In this embodiment, methylcyclohexane is used.

E. the polythiophene nanowire treated by the neutral organic solvent is added to a solution containing minor content of polythiophene and major content of one material selected from carbon nano-tube, graphene and carbon nano-capsule (e.g. PCBM) or one of mixtures thereof to enable carbon nano-tube, graphene or carbon nano-capsule (e.g. PCBM) to be filled between the polythiophene nanowires and generate a material for the active layer in bulk heterojunction structure. In this embodiment, the said solution contains carbon nano-tube, graphene and carbon nano-capsule (e.g. PCBM) and the mixing ratio of carbon nano-tube to grapheme to carbon nano-capsule is 0.1:0.1:1 to 1:1:1 to 10:10:1, preferably 0.2:0.3:1 or 0.4:0.2:1. The material for the active layer in heterojunction structure prepared in this step can be coated on a flat substrate by spin coating, drop casting, screen printing, coated printing, roller printing or spraying so that an active layer in hetero-junction structure can be formed on the substrate.

The high crystalline polythiophene nanowire prepared by the method of preparing high crystalline polythiophene nanowire for organic solar panels according to the present invention are used as donor material for the active layer in heterojunction structure due to high alignment order and high crystallinity. They are very helpful for elevating light conversion efficiency of organic solar panels.

From the explanations for the foregoing embodiments, operations, use and effect of the present invention could be sufficiently understood. The abovementioned embodiments are, however, the preferred embodiments of the present invention. So the scope of the present invention may not be hence limited. In other words, any simple equivalent amendment and modification made according to claims and description of the present invention falls within the scope of the present invention.

What is claimed is:

1. A method of preparing high crystalline polythiophene nanowires for organic solar panels, including the following steps:
    (a) dissolving polythiophene in a first organic solvent to generate a 0.001-40 wt % polythiophene solution, wherein the first organic solvent is selected from the group consisting of toluene, xylene, chloroform and mixtures thereof;
    (b) adding a carbon nano-material to a second organic solvent to generate a 0.01-10 wt % carbon nano-material suspension, wherein the second organic solvent is selected from the group consisting of toluene, xylene, chloroform and mixtures thereof, and adding 0.001-5 wt % of a dispersant to the suspension to generate a carbon nano-material dispersion;
    (c) adding the carbon nano-material dispersion to the polythiophene solution and allowing the resulting mixture to stand under atmospheric pressure at −10~45° C. for 20~400 minutes so that the polythiophene molecules are able to be adsorbed and stacked up on the surface of the carbon nano-material to generate high crystalline polythiophene nanowires, wherein the mixing ratio of the polythiophene solution to the carbon nano-material dispersion falls in the range between 1:0.01 and 1:10;
    (d) extracting the polythiophene nanowires from the mixture of the polythiophene solution and the carbon nano-material dispersion and removing the polythiophene molecules that are amorphous and adsorbed on the surface of the polythiophene nanowires with a neutral organic solvent, wherein the said neutral organic solvent is cyclohexane or methylcyclohexane; and
    (e) adding the polythiophene nanowires treated by the neutral organic solvent to a solution containing a minor content of polythiophene and a major content of a mixture of carbon nano-tube, graphene and carbon nano-capsule to enable the mixture to be filled between the polythiophene nanowires, wherein the mixture has mixing ratio of carbon nano-tube to graphene to carbon nano-capsule that is 0.2:0.3:1 or 0.4:0.2:1.

2. A method of preparing high crystalline polythiophene nanowires for organic solar panels, including the following steps:
    (a) dissolving polythiophene in a first organic solvent to generate a 0.001-40 wt % polythiophene solution, wherein the first organic solvent is selected from the group consisting of toluene, xylene, chloroform and mixtures thereof;
    (b) adding a carbon nano-material to a second organic solvent to generate a 0.01-10 wt % carbon nano-material suspension, wherein the carbon nano-material is selected from the group consisting of graphene, carbon nanocapsule, carbon nanotube and mixtures thereof and the second organic solvent is selected from the group consisting of toluene, xylene, chloroform and mixtures thereof, and adding 0.001-5 wt % of a dispersant to the suspension to generate a carbon nano-material dispersion;
    (c) adding the carbon nano-material dispersion to the polythiophene solution and allowing the resulting mixture to stand under atmospheric pressure at −10~45° C. for 20~400 minutes so that the polythiophene molecules are able to be adsorbed and stacked up on the surface of the carbon nano-material to generate high crystalline polythiophene nanowires, wherein the mixing ratio of the polythiophene solution to the carbon nano-material dispersion falls in the range between 1:0.01 and 1:10;
    (d) extracting the polythiophene nanowires from the mixture of the polythiophene solution and the carbon nano-material dispersion and removing the polythiophene molecules that are amorphous and adsorbed on the surface of the polythiophene nanowires with a neutral organic solvent, wherein the said neutral organic solvent is cyclohexane or methylcyclohexane; and
    (e) adding the polythiophene nanowires treated by the neutral organic solvent to a solution containing a minor content of polythiophene and a major content of a mixture of carbon nano-tube, graphene and carbon nano-capsule to enable the mixture to be filled between the polythiophene nanowires, wherein the mixture has mixing ratio of carbon nano-tube to graphene to carbon nano-capsule that is 0.2:0.3:1 or 0.4:0.2:1.

3. A method of preparing high crystalline polythiophene nanowires for organic solar panels, including the following steps:

(a) dissolving polythiophene in a first organic solvent to generate a 0.001-40 wt % polythiophene solution, wherein the first organic solvent is selected from the group consisting of toluene, xylene, chloroform and mixtures thereof;

(b) adding a carbon nano-material to a second organic solvent to generate a 0.01-10 wt % carbon nano-material suspension, wherein the second organic solvent is selected from the group consisting of toluene, xylene, chloroform and mixtures thereof, and adding 0.001-5 wt % of a dispersant to the suspension to generate a carbon nano-material dispersion, wherein the dispersant is selected from the group consisting of naphthalene, anthracene, phenanthrene, hydrocarbon-substituted naphthalene, hydrocarbon-substituted anthracene, hydrocarbon-substituted phenanthrene, oxidized hydrocarbon-substituted naphthalene, oxidized hydrocarbon-substituted anthracene, oxidized hydrocarbon-substituted phenanthrene and mixtures thereof;

(c) adding the carbon nano-material dispersion to the polythiophene solution and allowing the resulting mixture to stand under atmospheric pressure at −10~45° C. for 20~400 minutes so that the polythiophene molecules are able to be adsorbed and stacked up on the surface of the carbon nano-material to generate high crystalline polythiophene nanowires, wherein the mixing ratio of the polythiophene solution to the carbon nano-material dispersion falls in the range between 1:0.01 and 1:10;

(d) extracting the polythiophene nanowires from the mixture of the polythiophene solution and the carbon nano-material dispersion and removing the polythiophene molecules that are amorphous and adsorbed on the surface of the polythiophene nanowires with a neutral organic solvent, wherein the said neutral organic solvent is cyclohexane or methylcyclohexane; and (e) adding the polythiophene nanowires treated by the neutral organic solvent to a solution containing a minor content of polythiophene and a major content of a mixture of carbon nano-tube, graphene and carbon nano-capsule to enable the mixture to be filled between the polythiophene nanowires, wherein the mixture has mixing ratio of carbon nano-tube to graphene to carbon nano-capsule that is 0.2:0.3:1 or 0.4:0.2:1.

* * * * *